(12) United States Patent
Zhao et al.

(10) Patent No.: US 10,879,850 B2
(45) Date of Patent: Dec. 29, 2020

(54) RADIO FREQUENCY POWER AMPLIFIER FOR INHIBITING HARMONIC WAVE AND STRAY, CHIP AND COMMUNICATION TERMINAL

(71) Applicant: VANCHIP (TIANJIN) TECHNOLOGY CO., LTD., Tianjin (CN)

(72) Inventors: Jinxin Zhao, Tianjin (CN); Yunfang Bai, Tianjin (CN); Sheng Lin, Tianjin (CN)

(73) Assignee: VANCHIP (TIANJIN) TECHNOLOGY CO., LTD., Tianjin (CN)

( * ) Notice: Subject to any disclaimer, the term of this patent is extended or adjusted under 35 U.S.C. 154(b) by 0 days.

(21) Appl. No.: 16/346,037

(22) PCT Filed: Jun. 30, 2017

(86) PCT No.: PCT/CN2017/091347
§ 371 (c)(1),
(2) Date: Apr. 29, 2019

(87) PCT Pub. No.: WO2018/076766
PCT Pub. Date: May 3, 2018

(65) Prior Publication Data
US 2020/0186099 A1 Jun. 11, 2020

(30) Foreign Application Priority Data
Oct. 31, 2016 (CN) .......................... 2016 1 0927929

(51) Int. Cl.
*H03F 3/04* (2006.01)
*H03F 1/26* (2006.01)
(Continued)

(52) U.S. Cl.
CPC ................ *H03F 1/26* (2013.01); *H03F 1/32* (2013.01); *H03F 1/565* (2013.01); *H03F 3/245* (2013.01);
(Continued)

(58) Field of Classification Search
CPC ... H03F 1/26; H03F 1/565; H03F 1/32; H03F 3/245; H03F 2200/451; H03F 2200/387;
(Continued)

(56) References Cited

U.S. PATENT DOCUMENTS 10,080,192 B2 * 9/2018 Balteanu ................. H03F 3/211
10,224,876 B2 * 3/2019 Gorbachov ........... H03F 1/0216
(Continued)

FOREIGN PATENT DOCUMENTS

CN 101414806 A 4/2009
CN 201616811 U 10/2010
(Continued)

OTHER PUBLICATIONS

First Office action dated Jan. 28, 2019 and translation for related Chinese Application 201610927929.8 (CN 106549638 A) provided by Google Translate.
(Continued)

*Primary Examiner* — Khanh V Nguyen
(74) *Attorney, Agent, or Firm* — Ladas & Parry, LLP

(57) ABSTRACT

Disclosed are a radio frequency power amplifier for inhibiting a harmonic wave and stray, a chip and a communication terminal. The radio frequency power amplifier comprises a power source, an LDO circuit, a harmonic inhibition unit, a stray inhibition unit, an amplifying unit, and a low-pass matching network. On the one hand, by means of the power source being connected to the harmonic inhibition unit, harmonic waves and stray of the power source at a resonant frequency are inhibited. Additionally, by means of
(Continued)

the stray inhibition unit reducing the gain of the amplifying unit at a resonant frequency, output of stray is reduced. On the other hand, by means of the low-pass matching network being embedded at an output end of the radio frequency power amplifier, harmonic waves and the stray of a radio frequency signal amplified by the amplifying unit at different frequencies is effectively inhibited.

12 Claims, 3 Drawing Sheets

(51) Int. Cl.
| | | |
|---|---|---|
| *H03F 1/32* | (2006.01) | |
| *H03F 1/56* | (2006.01) | |
| *H03F 3/24* | (2006.01) | |
| *H04B 1/04* | (2006.01) | |

(52) U.S. Cl.
CPC .......... *H03F 3/04* (2013.01); *H03F 2200/387* (2013.01); *H03F 2200/451* (2013.01); *H04B 1/04* (2013.01)

(58) Field of Classification Search
CPC ................ H03F 1/0244; H03F 1/0211; H03F 2200/504; H03F 1/0227; H04B 1/04; H03G 3/3042; H03G 3/004
USPC ................................................ 330/127, 297
See application file for complete search history.

(56) References Cited

U.S. PATENT DOCUMENTS

| | | |
|---|---|---|
| 2007/0182490 A1 | 8/2007 | Hau et al. |
| 2009/0096531 A1 | 4/2009 | Shimamoto et al. |
| 2013/0135043 A1 | 5/2013 | Hietala et al. |
| 2014/0253244 A1 | 9/2014 | Folkmann |
| 2014/0266455 A1 | 9/2014 | Kaatz et al. |

FOREIGN PATENT DOCUMENTS

| | | |
|---|---|---|
| CN | 101882910 A | 11/2010 |
| CN | 102158078 A | 8/2011 |
| CN | 102983823 A | 3/2013 |
| CN | 104579189 A | 4/2015 |
| CN | 104716906 | 6/2015 |
| CN | 104904119 | 9/2015 |
| CN | 106549638 A | 3/2017 |
| JP | H08148949 A | 6/1996 |
| WO | 2013188712 A1 | 12/2013 |
| WO | 2014087479 A1 | 6/2014 |

OTHER PUBLICATIONS

International Search Report for PCT/CN2017/091347 dated Oct. 11, 2017 and its English translation provided by WIPO.
Written Opinion of the International Search Authority for PCT/CN2017/091347 dated Oct. 11, 2017 and its English translation provided by Google Translate . . . .
First Office Action from CN app. No. 201610927929, dated Jan. 28, 2019, with English translation from Global Dossier.
Second Office Action from CN app. No. 201610927929, dated Sep. 10, 2019, with English translation from Global Dossier.
Third Office Action from CN app. No. 201610927929, dated Mar. 9, 2020, with English translation from Global Dossier.
Extended European Search Report from EP app. No. 17866024.7, dated May 29, 2020.
Communication pursuant to Rules 70(2) and 70a(2) EPC from EP app. No. 17866024.7, dated Jun. 17, 2020.
Written Opinion of the International Searching Authority from PCT/CN2017/091347, dated Oct. 11, 2017, with English translation from WIPO.
International Preliminary Report on Patentability from PCT/CN2017/091347, dated Apr. 30, 2019, with English translation from WIPO.

\* cited by examiner

RADIO FREQUENCY POWER AMPLIFIER FOR INHIBITING HARMONIC WAVE AND STRAY, CHIP AND COMMUNICATION TERMINAL

CROSS-REFERENCE TO RELATED APPLICATIONS

The current application is the US national phase filing of PCT application No. PCT/CN2017/091347 filed on Jun. 30, 2017, which claims priority to Chinese Application No. 201610927929.8 filed on Oct. 31, 2016, the disclosures of which are incorporated herein by reference in their entireties.

BACKGROUND

Technical Field

The present invention relates to a radio frequency power amplifier, particularly relates to a radio frequency power amplifier capable of inhibiting harmonic wave and stray, also relates to a chip including the radio frequency power amplifier and a communication terminal including the radio frequency power amplifier, and belongs to the technical field of integrated circuits.

Related Art

With the rapid development of the wireless communication technology, the linear performance requirements for wireless transceivers are gradually increasing. A radio frequency power amplifier as the last level in a transmitter greatly influences the linear performance of a whole transceiver. Generally, the last level of the radio frequency power amplifier adopts a class A or class B power amplifier. Due to the influence of nonlinear distortion, when a signal is increased to a certain extent, the radio frequency power amplifier generates a series of harmonic waves and strays because the radio frequency power amplifier works in a nonlinear region, the linear performance of the radio frequency power amplifier is greatly influenced, and thus, inhibition of the harmonic wave and stray becomes an important measure for enhancing the linearity of the radio frequency power amplifier.

The Chinese patent application with the application number of 201510057384.5 discloses a circuit structure for improving the harmonic performance of a radio frequency power amplifier. The circuit structure includes a radio frequency power amplifying tube, a second harmonic inhibition network, a third harmonic inhibition network, a higher harmonic inhibition network, a first matching inductor, a second matching inductor and a blocking capacitor. The first matching inductor, the second matching inductor, the third harmonic inhibition network and the higher harmonic inhibition network form a low-pass output matching network of the power amplifier, and the low-pass output matching network is connected to a collector electrode of the power amplifying tube. The second harmonic inhibition network is connected to the collector electrode of the power amplifying tube and is independent of the output matching network, and the inhibition frequency is adjustable. The third harmonic inhibition network and the higher harmonic inhibition network are involved in the output matching network, and the higher harmonic inhibition frequency is adjustable. The circuit structure effectively inhibits a harmonic component generated by the radio frequency power amplifier and improves the performance of the power amplifier.

However, the radio frequency power amplifier in the transmitter may also generate out-of-band stray output, and the stray output is positioned in a frequency band of a receiver. If the stray output cannot be well isolated, the stray output may be coupled to an input end of a low noise amplifier at the front end of the receiver to form interference, or may also interfere with other adjacent channels. Therefore, the radio frequency power amplifier needs to be further improved to ensure that the improved radio frequency power amplifier not only can inhibit the harmonic wave but also can limit out-of-band spurious output.

SUMMARY

The present invention aims to solve the first technical problem and provide a radio frequency power amplifier capable of inhibiting harmonic wave and stray.

The present invention aims to solve another technical problem and provide a chip including the radio frequency power amplifier and a communication terminal including the radio frequency power amplifier.

To implement the foregoing purposes of the present invention, the present invention uses the following technical solutions.

According to a first aspect of the embodiments of the present invention, a radio frequency power amplifier for inhibiting harmonic wave and stray is provided, including a power source, an LDO circuit, a harmonic wave inhibiting unit, a stray inhibiting unit, an amplifying unit and a low-pass matching network.

The power source is connected to the harmonic wave inhibiting unit, and the stray inhibiting unit is arranged between the LDO circuit and the amplifying unit.

The low-pass matching network is arranged at an output end of the amplifying unit, a plurality of resonance frequencies are generated by means of the low-pass matching network, and a harmonic wave and stray of a radio frequency signal amplified by the amplifying unit at the resonance frequencies are inhibited.

Preferably, the power source includes a first power source and a second power source, and the first power source and the second power source share the harmonic wave inhibiting unit.

Preferably, one end of the harmonic wave inhibiting unit is respectively connected to the power sources, and the other end of the harmonic wave inhibiting unit is grounded. A plurality of resonance frequencies are generated by means of the harmonic wave inhibiting unit, and the harmonic wave and stray of the power source at the resonance frequencies are inhibited.

Preferably, the harmonic wave inhibiting unit is an LC array which is composed of a plurality of LC series resonance circuits connected in parallel, and each LC series resonance circuit is composed of a capacitor and an inductor connected in series.

Preferably, the stray inhibiting unit is composed of a plurality of loads in cascade, and each level of load is connected to the next level of load by means of an isolation inductor so as to realize isolation of stray.

Preferably, each level of load includes a load inductor and an LC array, one end of the LC array is respectively connected to the load inductor and the isolation inductor, and the other end of the LC array is grounded.

The other end of the load inductor is connected to a collector electrode or a drain electrode of a corresponding transistor in the amplifying unit, and an emitter electrode or a source electrode of the transistor is grounded.

A plurality of resonance points of which the frequencies are lower than a working frequency and resonance frequencies corresponding to the resonance points are generated by means of each level of load, and the stray of the transistor at the resonance frequencies is inhibited.

Preferably, the number of the resonance points generated in each level of load and the resonance frequencies are independent of each other, and the stray of the transistor at different frequencies is inhibited by means of flexible configuration.

Preferably, the low-pass matching network is a multi-level matching network which is composed of a plurality of matching networks in cascade, and each level of matching network is composed of a first inductor, a first capacitor, a second inductor and a second capacitor.

The first inductor and the first capacitor are connected in parallel to form an LC parallel resonance circuit, and the second inductor and the second capacitor are connected in series to form an LC series resonance circuit.

One end of the LC series resonance circuit is respectively connected to the LC parallel resonance circuit of the current level of matching network and the LC parallel resonance circuit of the next level of matching network, and the other end of the LC series resonance circuit is grounded.

Preferably, in each level of matching network, the resonance frequency of the LC parallel resonance circuit is higher than the working frequency, the resonance frequency of the LC series resonance circuit is higher than the working frequency, and a harmonic wave and stray of a radio frequency signal at the resonance frequency are inhibited by means of voltage division action and current division action.

Preferably, the amplifying unit is composed of at least one level of amplifying circuit in cascade.

Each level of amplifying circuit is composed of transistors, and all levels of amplifying circuits are connected by means of capacitors.

Each level of amplifying circuit is respectively connected to the stray inhibiting unit.

According to a second aspect of the embodiments of the present invention, a chip is provided, including any one of the above radio frequency power amplifiers.

According to a third aspect of the embodiments of the present invention, a communication terminal is provided, including any one of the above radio frequency power amplifiers.

The radio frequency power amplifier provided by the present invention has the following advantageous effects: on the one hand, the first power source and the second power source share the harmonic wave inhibiting unit so as to inhibit the harmonic wave and stray of the first power source and the second power source at the resonance frequency, and the gain of the amplifying unit at the resonance frequency is reduced by means of the stray inhibiting unit, so as to reduce output stray. On the other hand, the low-pass matching network is embedded in the output end of the radio frequency power amplifier so as to inhibit the harmonic wave and stray of the radio frequency signal amplified by the amplifying unit at different frequencies. Furthermore, because the radio frequency power amplifier realizes effective inhibition of the harmonic wave and stray mainly by connecting an LC array to a power source path and using the low-pass matching network, the design complexity of the radio frequency power amplifier is simplified, and the cost for realizing the related design is lowered.

DETAILED DESCRIPTION

The following further describes technical contents of the present invention in details with reference to accompanying diagrams and specific embodiments.

Firstly, it should be noted that a communication terminal involved in each embodiment of the present invention refers to computer device which can be used in a mobile environment and supports multiple communication systems such as GSM, EDGE, TD_SCDMA, TDD_LTE and FDD_LTE, and the computer device includes a mobile phone, a notebook computer, a tablet computer, an on-board computer or the like. In addition, the radio frequency power amplifier is also suitable for other application occasions of power amplifying circuits, such as communication base stations compatible with various communication systems.

Figure 1:
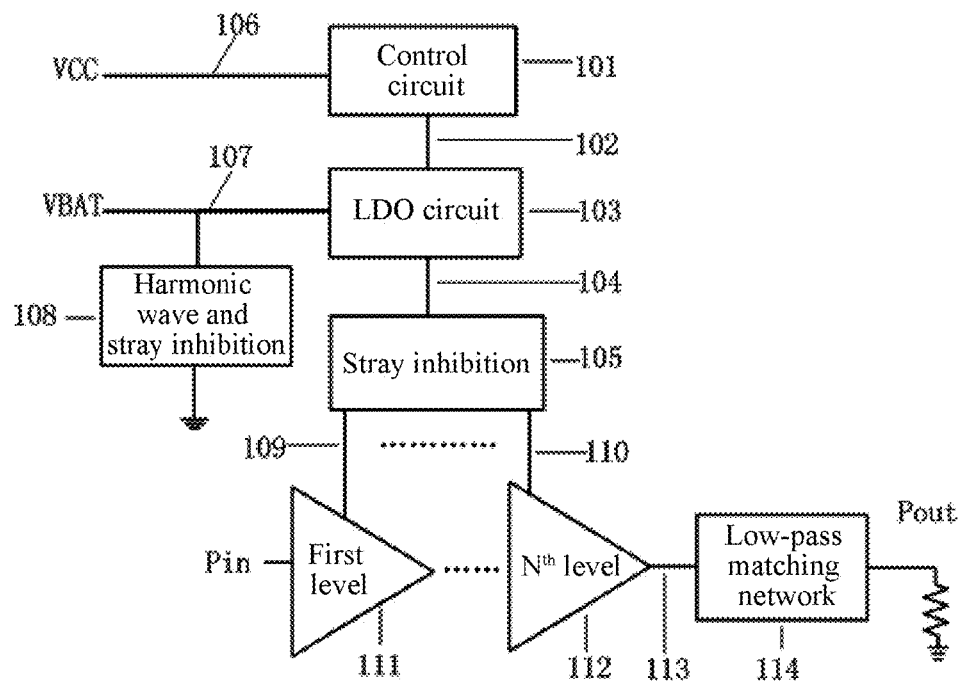
FIG. 1 is a schematic circuit diagram of a radio frequency power amplifier provided by the present invention.

FIG. 1 is a schematic circuit diagram of a radio frequency power amplifier capable of inhibiting harmonic wave and stray provided by the present invention. As shown in FIG. 1, the radio frequency power amplifier includes a control circuit 101, an LDO (low dropout regulator) circuit 103, a stray inhibiting unit 105, a harmonic wave inhibiting unit 108, an amplifying unit and a low-pass matching network 114. A first power source 106 supplies a power supply voltage for the control circuit 101 to enable the control circuit 101 to generate a control voltage 102, and the LDO circuit 103 is controlled by means of the control voltage 102 and a second power source 107, so as to output different voltages 104 according to different power levels. The harmonic wave inhibiting unit 108 is arranged between the second power source 107 and the ground, to effectively inhibit harmonic wave and stray components generated in a power supply process of the second power source 107 and supply a stable power supply voltage for the LDO circuit 103, thereby inhibiting the harmonic wave and stray components in the voltage 104 output by the LDO circuit 103. The stray inhibiting unit 105 is arranged between the voltage 104 and the amplifying unit to reduce the gain of the amplifying unit at the resonance frequency, thereby reducing the output stray (the stray is mainly generated by the amplifying unit and is not generated by the LDO circuit). An amplified radio frequency signal is finally output to a load (such as an antenna) by means of the low-pass matching network 114. By means of the low-pass matching network 114, impedance matching can be realized, and the harmonic wave and stray in the output radio frequency signal can also be inhibited, so that interference is avoided even if the radio frequency signal falls into a receiving frequency band of another system.

In one embodiment of the present invention, the amplifying unit can be composed of one or more than one transistor (including but not limited to field effect transistors or bipolar transistors, the same below), and can also be a multi-level amplifying circuit composed of a plurality of amplifying circuits in cascade. These transistors can be the same type of transistors or different types of transistors. As shown in FIG. 1, the multi-level amplifying circuit is composed of a first level of amplifying circuit 111 and an $N^{th}$ (N is a positive integer) level of amplifying circuit 112 in cascade. In FIG. 1, for the sake of simplicity, only the first level of amplifying circuit 111 and the last level of amplifying circuit 112 are shown. A plurality of amplifying circuits can be arranged between the first level of amplifying circuit 111 and the last level of amplifying circuit 112. By respectively connecting a plurality of amplifying circuits with the stray inhibiting unit 105, the stray generated by the amplifying unit can be effectively inhibited.

In one embodiment of the present invention, the LDO circuit 103 can be any LDO capable of outputting different voltages according to different power levels. The LDO ensures that the voltage difference between ports of the transistors does not exceed a nominal voltage value of a self-process, thereby preventing the voltage difference between the ports of the transistors from exceeding a nominal withstand voltage value of the self-process along with the increase of the power voltage, so as to prevent the device from being burnt out.

Figure 2:
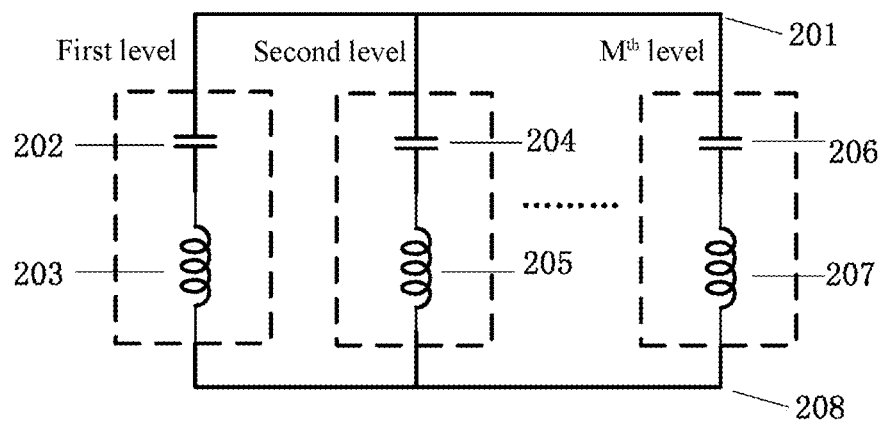
FIG. 2 is a schematic diagram of a harmonic wave inhibiting unit in the radio frequency power amplifier provided by the present invention.

FIG. 2 is a schematic circuit diagram of the harmonic wave inhibiting unit 108 in one embodiment of the radio frequency power amplifier. As shown in FIG. 2, the harmonic wave inhibiting unit 108 is an LC array which is composed of M (M is a positive integer, the same below) LC series resonance circuits connected in parallel. Each LC series resonance circuit is composed of a capacitor and an inductor connected in series. Referring to a dotted line box in FIG. 2, a capacitor 202 and an inductor 203 are connected in series to form a first level of series resonance circuit, a capacitor 204 and an inductor 205 form a second level of series resonance circuit, and accordingly, a capacitor 206 and an inductor 207 form an $M^{th}$ level of series resonance circuit. The LC array can have any number of levels, and the first level of series resonance circuit, the second level of series resonance circuit and the $M^{th}$ level of series resonance circuit are connected in parallel to form the LC array. One end 201 of the harmonic wave inhibiting unit 108 of the radio frequency power amplifier is connected to the second power source 107, and the other end 208 of the harmonic wave inhibiting unit 108 is grounded. The capacitor 202 and the inductor 203 generate a resonance frequency f1, the capacitor 204 and the inductor 205 generate a resonance frequency f2, the capacitor 206 and the inductor 207 generate a resonance frequency fM, and the earth impedance of the second power source 107 is low at the frequency f1, the frequency f2 and the frequency fM, so that the harmonic wave and stray of the second power source 107 at the frequency f1, the frequency f2 and the frequency fM can be inhibited. The frequency f1, the frequency f2 and the frequency fM can be set to be any different frequencies (higher than the working frequency or lower than the working frequency). The harmonic wave inhibiting unit 108 is embedded between the second power source 107 and the ground to inhibit the harmonic wave and stray of the second power source in a power supply process at different resonance frequencies.

Figure 3:
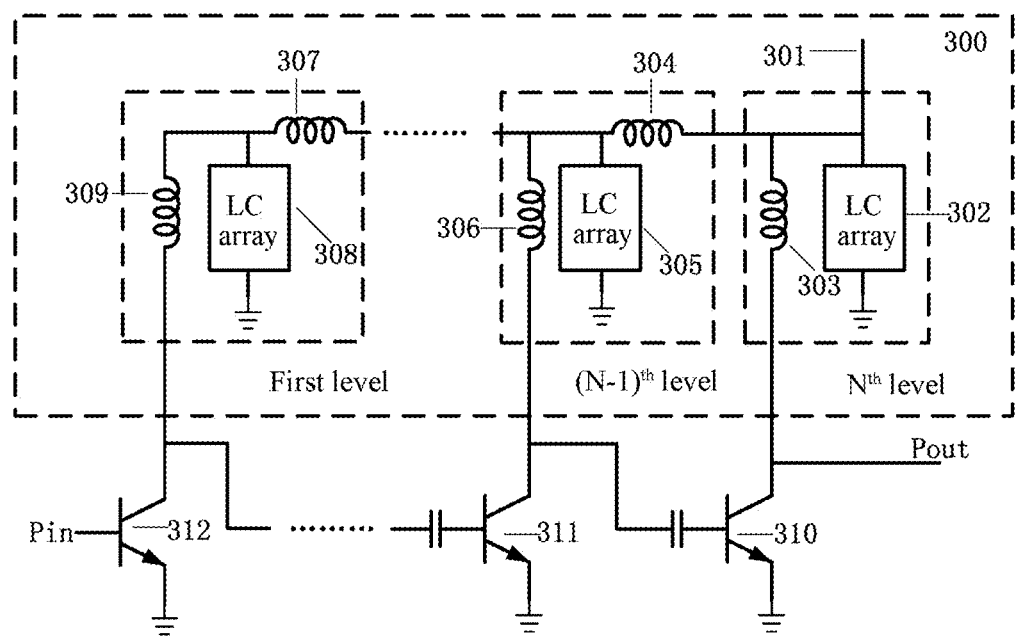
FIG. 3 is a schematic diagram showing connection between a stray inhibiting unit and an amplifying unit in the radio frequency power amplifier provided by the present invention.

FIG. 3 is a schematic diagram showing connection between the stray inhibiting unit 105 and the amplifying unit in one embodiment of the radio frequency power amplifier. As shown in the dotted line box in FIG. 3, a first level of load (namely the load of a first level of amplifying circuit) is composed of an inductor 307, an LC array 308 and an inductor 309. One end of the LC array 308 is respectively connected to one end of the inductor 307 and one end of the inductor 309, and the other end of the LC array 308 is grounded. The inductor 309 serves as a load inductor of the first level of amplifying circuit, and the other end of the load inductor 309 is connected to a collector electrode or a drain electrode (not shown in FIG. 3) of a transistor 312 of the first level of amplifying circuit, so that a load function can be realized, and furthermore, the stray can be inhibited. The inductor 307 serves as an inter-level isolation inductor, the other end of the inductor 307 is connected to a second level of load, and the second level of load is the same as the first level of load. In order to simplify the description, only the first level of load, an $(N-1)^{th}$ level of load and an $N^{th}$ (N is a positive integer, the same below) of load are shown in FIG. 3. The $(N-1)^{th}$ level of load (the load of an $(N-1)^{th}$ level of amplifying circuit) is composed of an inductor 304, an LC array 305 and an inductor 306. One end of the LC array 305 is respectively connected to one end of the inductor 304 and one end of the inductor 306, and the other end of the LC array 308 is grounded. The inductor 306 serves as a load inductor of the $(N-1)^{th}$ level of amplifying circuit, and the other end of the load inductor 306 is connected to a collector electrode or a drain electrode (not shown in FIG. 3) of a transistor 311 of the $(N-1)^{th}$ level of amplifying circuit, so that the load function can be realized, and furthermore, the stray can be inhibited. The inductor 304 serves as an inter-level isolation inductor, and the other end of the inductor 304 is connected to the $N^{th}$ level of load. Generally, the inductance value of the inductor 304 and the inductance value of the inductor 307 are larger so as to realize isolation of stray. The $N^{th}$ level of load (namely the load of an $N^{th}$ level of amplifying circuit) is composed of an inductor 303 and an LC array 302. One end of the LC array 302 is respectively connected to one end of the inductor 303 and a voltage source 301 (voltage 104 in FIG. 1), and the other end of the LC array 302 is grounded. The inductor 303 serves as a load inductor of the $N^{th}$ level of amplifying circuit, and the other end of the load inductor 303 is connected to a collector electrode or a drain electrode (not shown in FIG. 3) of a transistor 310 of the $N^{th}$ level of amplifying circuit, so that the load function can be realized, and furthermore, the stray can be inhibited. In conclusion, the stray inhibiting unit 105 is composed of loads of N amplifying circuits in cascade, and the isolation inductor in each level of load is connected to the next level of load to realize isolation of stray in the amplifying unit. Furthermore, the load inductor in each level of load is respectively connected to the collector electrode or the drain electrode of the transistor in the corresponding amplifying circuit to realize an inhibiting effect on stray of the transistor in each level of amplifying circuit. The voltage source 301 supplies a power supply voltage to the corresponding amplifying circuit by means of each level of load respectively, and filters out the stray interference to a radio frequency signal for each level of amplifying circuit by means of the stray inhibiting unit 105. The radio frequency signal is transmitted into the amplifying unit, a capacitor is arranged between every two levels of amplifying circuits of the amplifying unit, the radio frequency signal amplified by the previous level of amplifying circuit is transmitted to the next level of amplifying circuit by means of the capacitor, and finally, the amplified radio frequency signal is output to the outside by means of the last level of amplifying circuit.

Figure 4:
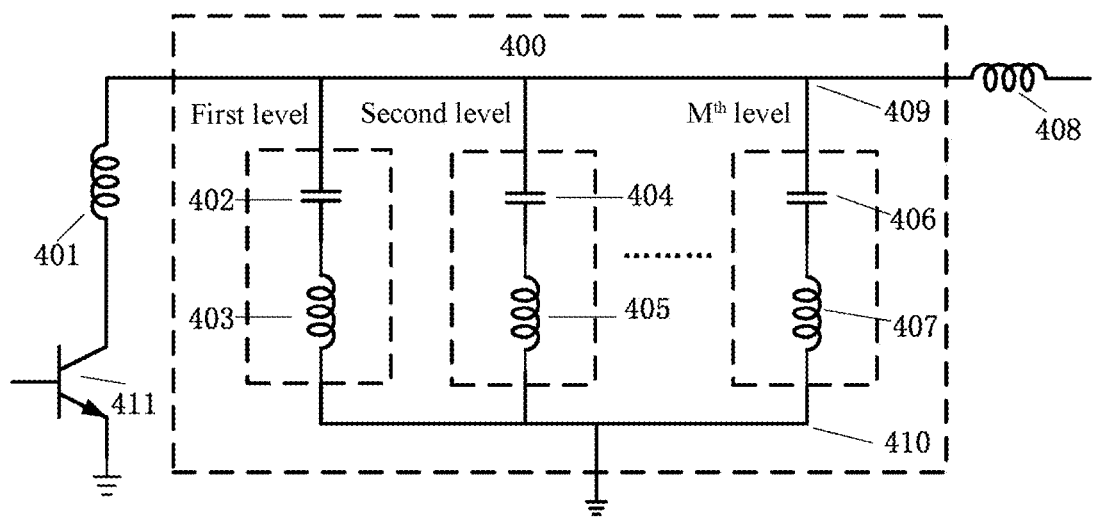
FIG. 4 is a schematic diagram showing connection between each level of load of the stray inhibiting unit and a corresponding amplifying circuit in the radio frequency power amplifier provided by the present invention.

FIG. 4 is a schematic diagram showing connection between each level of load of the stray inhibiting unit 105 and the corresponding amplifying circuit. As shown in FIG. 4, each level of load is composed of a load inductor and an LC array 400, and every two levels of loads are connected by means of an isolation inductor. The LC array 400 is composed of M (M is a positive integer, the same below) LC series resonance circuits connected in parallel, and each LC series resonance circuit is composed of a capacitor and an inductor connected in series. Referring to a dotted line box in FIG. 4, a capacitor 402 and an inductor 403 are connected in series to form a first level of series resonance circuit, a capacitor 404 and an inductor 405 form a second level of series resonance circuit, and a capacitor 406 and an inductor 407 form an $M^{th}$ level of series resonance circuit. The LC array can have any number of levels, and the first level of series resonance circuit, the second level of series resonance circuit and the $M^{th}$ level of series resonance circuit are connected in parallel to form the LC array 400. One end 409 of the LC array 400 is respectively connected to one end of a load inductor 401 and one end of an isolation inductor 408, the other end 410 of the LC array 400 is grounded, the other end of the load inductor 401 is connected to a collector electrode or a drain electrode (not shown in FIG. 4) of a transistor 411 in the amplifying unit, and an emitter electrode or a source electrode of the transistor 411 is grounded. Because the isolation inductor 408 is an inter-level isolation inductor, the isolation inductor 408 can be regarded as high impedance, the load inductor 401 and the LC array 400 generate M resonance points, and resonance frequencies corresponding to the M resonance points are respectively f1, f2, . . . , and fM. The earth impedance of the transistor 411 is low at the M frequencies, thereby inhibiting the stray of the transistor 411 at the M frequencies. In order to consider the performance of a working band, the frequencies f1, f2, . . . , and fM are set to be lower than the working frequency, so that the LC array 400 can be matched with the load inductor 401 to inhibit the stray at a frequency lower than the working frequency. In conclusion, the load inductor in each level of load and the LC array generate a plurality of resonance points of which the frequencies are lower than the working frequency, and the number of the resonance points generated in each level of load and the resonance frequencies are independent of each other, so that the stray at different frequencies can be inhibited by means of flexible configuration.

Figure 5:
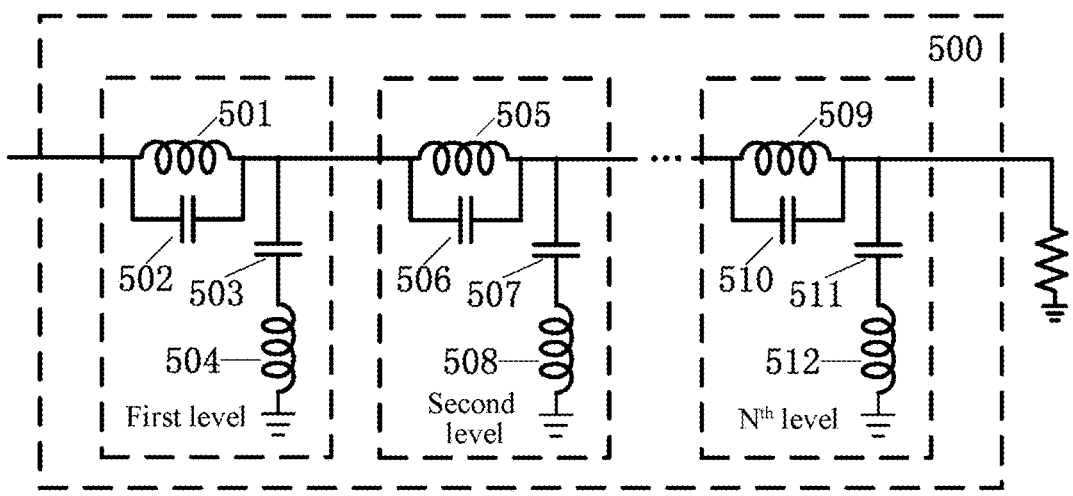
FIG. 5 is a schematic circuit diagram of the low-pass matching network in the radio frequency power amplifier provided by the present invention.

FIG. 5 is a schematic circuit diagram of the low-pass matching network in one embodiment of the radio frequency power amplifier. As shown in FIG. 5, the low-pass matching network 500 (marked 114 in FIG. 1) is a multi-level matching network which is composed of N (N is a positive integer, the same below) matching networks in cascade. Each level of matching network is composed of a first inductor, a first capacitor, a second inductor and a second capacitor, the first inductor and the first capacitor are connected in parallel to form an LC parallel resonance circuit, the second inductor and the second capacitor are connected in series to form an LC series resonance circuit, one end of the LC series resonance circuit is connected to the LC parallel resonance circuit, and the other end of the LC series resonance circuit is grounded. In each level of matching network, the resonance frequency f1 of the LC parallel resonance circuit is set to be higher than the working frequency, and the resonance frequency f2 of the LC series resonance circuit is set to be higher than the working frequency. In the LC parallel resonance circuit, the first inductor and the first capacitor are connected in parallel to show high impedance at the resonance frequency f1, and the harmonic wave and stray at the resonance frequency f1 can be inhibited by means of voltage division action. In the LC series resonance circuit, the second inductor and the second capacitor are connected in series to show low earth impedance at the resonance frequency f2, and the harmonic wave and stray at the resonance frequency f2 can be inhibited by means of current division action. In each level of matching network, the LC parallel resonance circuit shows inductivity at the working frequency, and the LC series resonance circuit shows capacitivity at the working frequency, so that each level of matching network is an L-C low-pass matching network at the working frequency. Specifically, as shown in FIG. 5, an inductor 501, an inductor 502, a capacitor 503 and an inductor 504 form a first level of matching network, an inductor 505, an inductor 506, a capacitor 507 and an inductor 508 form a second level of matching network, and an inductor 509, an inductor 510, a capacitor 511 and an inductor 512 form an $N^{th}$ level of matching network. The inductor 501 and the inductor 502 are connected in parallel to form an LC parallel resonance circuit, and the inductor 502 and the capacitor 503 are connected in series to form an LC series resonance circuit. In the second level of matching network, . . . , and the $N^{th}$ level of matching network, the inductor 505 and the inductor 506, the capacitor 507 and the inductor 508, the inductor 509 and the inductor 510 as well as the capacitor 511 and the inductor 512 respectively form an LC parallel resonance circuit and an LC series resonance circuit, and the working principle of each level of matching network has been explained above and will not be described herein.

In the low-pass matching network of the radio frequency power amplifier, one end of the LC parallel resonance circuit of each level of matching network is respectively connected to one end of the LC series resonance circuit of the current level of matching network and the LC parallel resonance circuit of the next level of matching network, and the other end of the LC series resonance circuit of each level of matching network is grounded. The harmonic wave and stray in the radio frequency signal amplified by the amplifying unit can be filtered out by means of the low-pass matching network, so as to ensure the stability of the output radio frequency signal. Because each level of matching network can generate 2 resonance points, the low-pass matching network can generate 2N (N is a positive integer, the same below) resonance points in total. Furthermore, the 2N resonance points can be configured independently of each other, so that a low-pass impedance matching function is realized, and further, the effect of inhibiting the harmonic wave and stray is achieved.

Figure 6:
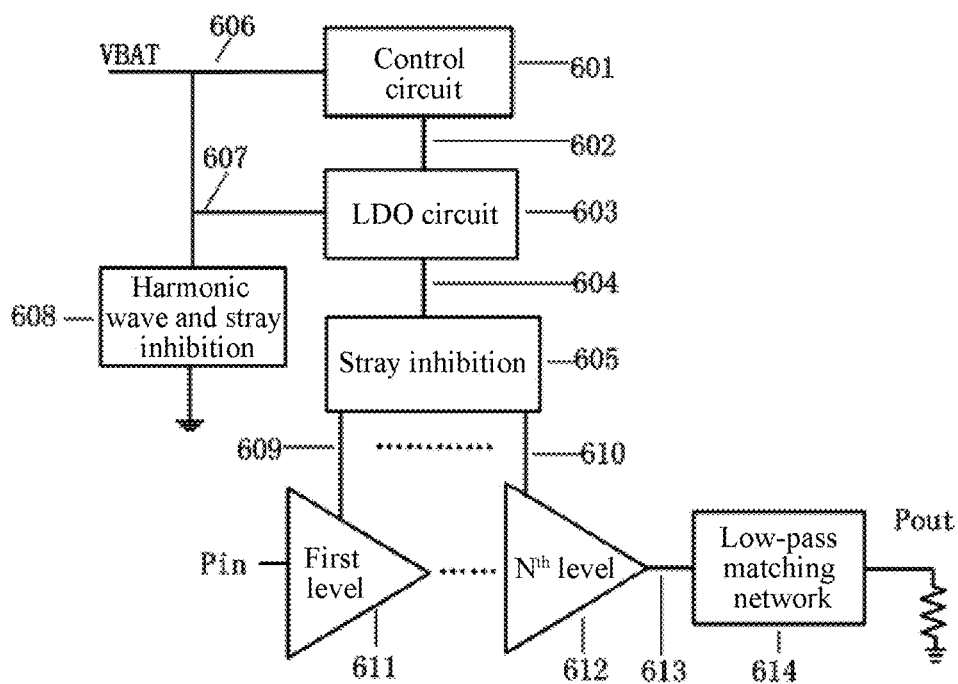
FIG. 6 is a schematic circuit diagram of another radio frequency power amplifier provided by the present invention.

It should be noted that, in order to avoid the condition that the first power source 106 of the radio frequency power amplifier provided by the present invention may generate harmonic wave and stray components under coupling action in a process of supplying a power supply voltage for the control circuit 101, the first power source 106 and the second power source 107 can be connected together, and the first power source 106 and the second power source 107 share the harmonic wave inhibiting unit 108, thereby realizing inhibition of the harmonic wave and stray components generated in the power supply processes of the first power source 106 and the second power source 107. Accordingly, another embodiment of the radio frequency power amplifier shown in FIG. 6 may be referred to. In this embodiment, a harmonic wave inhibiting unit 608 (namely the harmonic wave inhibiting unit 108 in FIG. 1) realizes inhibition of the harmonic wave and stray in a first power source 606 (namely the first power source 106 in FIG. 1) and a second power source 607 (namely the second power source 107 in FIG. 1), and respectively supplies power supply voltages for a control circuit 601 and an LDO circuit 603, so that a control voltage 602 generated by the control circuit can control the LDO circuit 603 to output different voltages 604. A stray inhibiting unit 605 realizes effective inhibition of the stray generated by the voltages 604, and supplies a stable interference-free power supply voltage for the amplifying unit. A radio frequency signal is amplified by means of the amplifying unit (composed of a first level of amplifying circuit 611 to an $N^{th}$ level of amplifying circuit 612), the harmonic wave and stray are filtered out by means of a low-pass matching network 614, and finally, the amplified radio frequency signal is output to a load (antenna). Compared with the structure of the radio frequency power amplifier in FIG. 1, only a first power source 606 and a second power source 607 are connected together in the structure of the radio frequency power amplifier in FIG. 6, so that the structure and principle of the radio frequency power amplifier are not described in detail.

According to the radio frequency power amplifier provided by the present invention, on the one hand, the first power source channel and the second power source channel share the harmonic wave inhibiting unit, and the harmonic wave inhibition unit adopts the LC array, thereby realizing inhibition of the harmonic wave and stray of the first power source and the second power source at the resonance frequency. A plurality of loads composed of load inductors and LC arrays are adopted, all levels of loads are connected in cascade by means of isolation inductors to form the stray inhibiting unit, and the stray inhibiting unit is utilized for inhibiting stray of the amplifying unit. On the other hand, the low-pass matching network is embedded in the output end of the radio frequency power amplifier, thereby realizing inhibition of the harmonic wave and stray of the radio frequency signal amplified by the amplifying unit at different frequencies. Simultaneously, the radio frequency power amplifier realizes effective inhibition of the harmonic wave and stray by connecting the LC array to the power source path and using the low-pass matching network, the design complexity of the radio frequency power amplifier is simplified, and the cost for realizing the related design is lowered.

The radio frequency power amplifier capable of inhibiting harmonic wave and stray can be applied to a chip. The specific structure and connection modes of the radio frequency power amplifier used in the chip are not specifically described herein.

In addition, the radio frequency power amplifier capable of inhibiting harmonic wave and stray provided by the present invention can also be applied to a communication terminal to serve as an important component of a radio frequency circuit. The communication terminal refers to computer device which can be used in a mobile environment and supports multiple communication systems such as GSM, EDGE, TD_SCDMA, TDD_LTE and FDD_LTE, and the computer device includes but not limited to a mobile phone, a notebook computer, a tablet computer, an on-board computer or the like. In addition, the radio frequency power amplifier is also suitable for other multi-mode technical application occasions, such as communication base stations compatible with various communication systems. The occasions are not described one by one in detail herein.

The radio frequency power amplifier for inhibiting harmonic wave and stray, the chip, and the communication terminal provided in the embodiments of the present invention are described in detail above. For a person of ordinary skill in the art, any obvious modification made to the present invention without departing from essence and spirit of the present invention will fall within the protection range of the claims of the present invention.

What is claimed is:

1. A radio frequency power amplifier for inhibiting harmonic wave and stray, comprising a power source, an LDO circuit, a harmonic wave inhibiting unit, a stray inhibiting unit, an amplifying unit and a low-pass matching network, wherein
    the power source is connected to the harmonic wave inhibiting unit, and the stray inhibiting unit is arranged between the LDO circuit and the amplifying unit; and
    the low-pass matching network is arranged at an output end of the amplifying unit, a plurality of resonance frequencies are generated by means of the low-pass matching network, and a harmonic wave and stray of a radio frequency signal amplified by the amplifying unit at the resonance frequencies are inhibited.

2. The radio frequency power amplifier according to claim 1, wherein
    the power source comprises a first power source and a second power source, and the first power source and the second power source share the harmonic wave inhibiting unit.

3. The radio frequency power amplifier according to claim 1, wherein
    one end of the harmonic wave inhibiting unit is respectively connected to the power source, and the other end of the harmonic wave inhibiting unit is grounded; and a plurality of resonance frequencies are generated by means of the harmonic wave inhibiting unit, and the harmonic wave and stray of the power source at the resonance frequencies are inhibited.

4. The radio frequency power amplifier according to claim 3, wherein
    the harmonic wave inhibiting unit is an LC array which is composed of a plurality of LC series resonance circuits connected in parallel, and each LC series resonance circuit is composed of a capacitor and an inductor connected in series.

5. The radio frequency power amplifier according to claim 1, wherein
    the stray inhibiting unit is composed of a plurality of loads in cascade, and each level of load is connected to the next level of load by means of an isolation inductor so as to realize isolation of stray.

6. The radio frequency power amplifier according to claim 5, wherein
    each level of load comprises a load inductor and an LC array, one end of the LC array is respectively connected to the load inductor and the isolation inductor, and the other end of the LC array is grounded;
    the other end of the load inductor is connected to a collector electrode or a drain electrode of a corresponding transistor in the amplifying unit, and an emitter electrode or a source electrode of the transistor is grounded; and
    a plurality of resonance points of which the resonance frequencies are lower than a working frequency and resonance frequencies corresponding to the resonance points are generated by means of each level of load, and the stray of the transistor at the resonance frequencies is inhibited.

7. The radio frequency power amplifier according to claim 6, wherein
the number of the resonance points generated in each level of load and the resonance frequencies are independent of each other, and the stray of the transistor at different frequencies is inhibited.

8. The radio frequency power amplifier according to claim 1, wherein
the low-pass matching network is a multi-level matching network which is composed of a plurality of matching networks in cascade, and each level of matching network is composed of a first inductor, a first capacitor, a second inductor and a second capacitor;
the first inductor and the first capacitor are connected in parallel to form an LC parallel resonance circuit, and the second inductor and the second capacitor are connected in series to form an LC series resonance circuit; and
one end of the LC series resonance circuit is respectively connected to the LC parallel resonance circuit of the current level of matching network and the LC parallel resonance circuit of the next level of matching network, and the other end of the LC series resonance circuit is grounded.

9. The radio frequency power amplifier according to claim 8, wherein
in each level of matching network, the resonance frequency of the LC parallel resonance circuit is higher than a working frequency, the resonance frequency of the LC series resonance circuit is higher than the working frequency, and a harmonic wave and stray of a radio frequency signal at the resonance frequency are inhibited by means of voltage division action and current division action.

10. The radio frequency power amplifier according to claim 1, wherein
the amplifying unit is a multi-level amplifying circuit which is composed of a plurality of amplifying circuits in cascade;
each level of amplifying circuit is composed of a transistor, and all levels of the amplifying circuits are connected by means of capacitors; and
each level of amplifying circuit is respectively connected to the stray inhibiting unit.

11. A chip, comprising the radio frequency power amplifier according to claim 1.

12. A communication terminal, comprising the radio frequency power amplifier according to claim 1.

* * * * *